United States Patent
Aoki et al.

(10) Patent No.: US 9,586,281 B2
(45) Date of Patent: Mar. 7, 2017

(54) FORMING A SOLDER JOINT BETWEEN METAL LAYERS

(71) Applicant: International Business Machines Corporation, Armonk, NY (US)

(72) Inventors: Toyohiro Aoki, Yokohama (JP); Akihiro Horibe, Yokohama (JP); Hiroyuki Mori, Yasu (JP); Yasumitsu Orii, Higashi Ohmi (JP); Kazushige Toriyama, Yamato (JP); Ting-Li Yang, Tainan (TW)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/832,044

(22) Filed: Aug. 21, 2015

(65) Prior Publication Data

US 2016/0066435 A1 Mar. 3, 2016

(30) Foreign Application Priority Data

Aug. 29, 2014 (JP) .................................. 2014-174773

(51) Int. Cl.
  *B23K 31/02* (2006.01)
  *B23K 1/00* (2006.01)
  (Continued)

(52) U.S. Cl.
  CPC .............. *B23K 1/0016* (2013.01); *B23K 1/19* (2013.01); *H05K 3/3494* (2013.01);
  (Continued)

(58) Field of Classification Search
  CPC .... B23K 1/0016; B23K 2203/56; B23K 1/19; B23K 31/02; B23K 2201/36–2201/42;
  (Continued)

(56) References Cited

U.S. PATENT DOCUMENTS 4,883,214 A * 11/1989 Zimmer ............... B23K 3/0471
  219/209
5,470,787 A * 11/1995 Greer ..................... H01L 24/10
  228/180.22
(Continued)

FOREIGN PATENT DOCUMENTS

| JP | 2002280417 A | 9/2002 |
| JP | 2005046882 A | 2/2005 |
| JP | 2015115363 A | 6/2015 |

OTHER PUBLICATIONS

Application No. 2014-174773 titled "Method of Forming Solder Joint Between Metal Layers," filed on Aug. 29, 2014, pp. 1-21.
(Continued)

*Primary Examiner* — Kiley Stoner
(74) *Attorney, Agent, or Firm* — L. Jeffrey Kelly

(57) ABSTRACT

Forming a solder joint between metal layers by preparing a structure having solder material placed between two metal layers and heating the structure to grow an intermetallic compound in a space between the two metal layers. Growing the intermetallic compound includes setting a first surface, in contact with the solder material between the two metal layers, to a first temperature, thereby enabling growth of the intermetallic compound; setting a second surface, in contact with the solder material between the two metal layers, to a second temperature, wherein the second temperature is higher than the first temperature; and maintaining a temperature gradient (temperature/unit thickness) between the two metal layers at a predetermined value or higher until the intermetallic compound substantially fills the space between the two metal layers.

12 Claims, 8 Drawing Sheets

(51) Int. Cl.
*B23K 1/19* (2006.01)
*H05K 3/34* (2006.01)

(52) U.S. Cl.
CPC ........ *B23K 2203/56* (2015.10); *H05K 3/3436* (2013.01); *H05K 3/3463* (2013.01)

(58) Field of Classification Search
CPC ............. H05K 3/3457; H05K 2203/04; H05K 3/3493; H05K 3/3436
USPC ............. 228/180.1–180.22, 227–228, 233.2, 228/245–255
See application file for complete search history.

(56) References Cited

U.S. PATENT DOCUMENTS

| | | | | |
|---|---|---|---|---|
| 6,123,250 | A * | 9/2000 | De Klein | B23K 1/012 228/180.1 |
| 6,138,893 | A * | 10/2000 | Caletka | B23K 3/08 228/102 |
| 6,805,974 | B2 * | 10/2004 | Choi | B23K 35/262 228/180.22 |
| 6,936,793 | B1 * | 8/2005 | Shiloh | B23K 1/008 126/21 A |
| 8,444,043 | B1 * | 5/2013 | Bernier | H01L 23/49816 228/179.1 |
| 2001/0045445 | A1 * | 11/2001 | Caletka | B23K 3/08 228/103 |
| 2005/0279812 | A1 * | 12/2005 | Tago | B23K 3/0623 228/180.5 |
| 2012/0125981 | A1 * | 5/2012 | Chang | B23K 1/0016 228/176 |
| 2013/0216842 | A1 * | 8/2013 | Kawamoto | B23K 31/02 428/450 |
| 2014/0054766 | A1 * | 2/2014 | Hashino | H01L 23/49866 257/737 |
| 2014/0061889 | A1 | 3/2014 | Noma et al. | |
| 2014/0363221 | A1 * | 12/2014 | Nakano | B23K 1/00 403/272 |
| 2015/0162312 | A1 * | 6/2015 | Shimizu | H01L 24/75 257/712 |
| 2015/0223347 | A1 * | 8/2015 | Elger | B23K 35/262 228/248.1 |

OTHER PUBLICATIONS

Yang et al., "Development of Novel Modified Solid-Liquid Interdiffusion (M-SLID) Bonding Technique for 3D Chip-Stacking Applications," Impact, International Microsystems, Packaging, Assembly and Circuits Technology Conference, 2014, pp. 1-7.

* cited by examiner

FORMING A SOLDER JOINT BETWEEN METAL LAYERS

BACKGROUND

The present invention relates to a method of forming a solder joint between metal layers and, more specifically, to a method of bonding a semiconductor chip to another semiconductor chip or a circuit board using a solder joint between metal layers.

Three-dimensional (3-D) and 2.5-dimensional (2.5-D) packaging is a technique facilitating higher bandwidths and shorter wiring lengths and is critical to realizing performance improvements in future computing systems. In 3-D and 2.5-D packaging, the joint terminal pitch and bump size are dramatically smaller than those in conventional flip chip packaging. As a result, faults due to stress on joints and their interfaces and faults due to electromigration (EM) caused by rising current densities (assuming a constant current) have become an issue.

In micro-joints, the joint (structure) is usually composed of a copper (Cu) pillar and solder cap in order to maintain a gap between substrates and joints for underfill (UF) and to prevent inter-solder shorting. The copper pillar is used to disperse the current flowing into the solder joint.

Generally speaking, there are two types of joints (structures). In the first type, all of the solder in the joint is an intermetallic compound (IMC). Here, two substrates with joints are pressed together using only weight control, or, as taught in Japanese Patent Application No. 2014-04198, the substrates are stored at a high temperature for a long time after they have been joined together. In the other type of joint, solder remains in the joint. Here, height control is added using reflow or a flip chip bonder (second joining method).

In the first joining method, the solder joint is made to be almost entirely an intermetallic compound and is therefore EM resistant, but stress is concentrated because of its shallow thickness. In the case of the second joining method, some of the solder has lower EM resistance than the first joining method so it still experiences problems with low EM resistance.

Therefore, improvement of EM resistance has been attempted using a structure in which the entire joint is made of an intermetallic compound (IMC) but enough thickness to suppress joint stress has been retained. For example, in a full IMC method in which a thick joint is made entirely of an intermetallic compound, the sample may be heated at a high temperature after joining. However, when a resin is present, such as in the pre-applied resin technique used in fine pitch applications, long-term, high-temperature heating methods experience problems from the standpoint of resin degradation.

SUMMARY

It is an object of the present invention to provide a solder joining method able to form an intermetallic compound in the entire solder joint between two metal layers (electrodes) in a shorter amount of time, while also maintaining a constant thickness in order to hold down the stress on the solder joint between the metal layers, improve EM resistance, and enable a pre-applied resin technique to be used.

One aspect of the present invention forms a solder joint between metal layers by preparing a structure having solder material placed between two metal layers and heating the structure to grow an intermetallic compound in a space between the two metal layers. Growing the intermetallic compound includes setting a first surface, in contact with the solder material between the two metal layers, to a first temperature, thereby enabling growth of the intermetallic compound; setting a second surface, in contact with the solder material between the two metal layers, to a second temperature, wherein the second temperature is higher than the first temperature; and maintaining a temperature gradient (temperature/unit thickness) between the two metal layers at a predetermined value or higher until the intermetallic compound substantially fills the space between the two metal layers.

In this aspect of the present invention, an intermetallic compound (IMC) can be grown between the two metal layers in a short period of time using temperature difference heating with a predetermined temperature gradient. As a result, an intermetallic compound (IMC) can be formed in the entire joint in a short period of time while also maintaining a constant thickness. This enables a solder joint to be obtained which suppresses the stress on the solder joint between the metal layers, improves EM resistance, and enables a pre-applied resin technique to be used.

Another aspect of the present invention solder-joins a semiconductor chip to a semiconductor substrate by preparing a circuit board having a plurality of first metal posts provided on a surface; preparing a semiconductor chip having a plurality of second metal posts aligned with the first metal posts provided on the surface of the circuit board, and having a solder material provided on the plurality of second metal posts; forming a structure by joining the plurality of first metal posts on the surface of the circuit board to the solder material on the plurality of corresponding second metal posts of the semiconductor chip; and heating the structure to grow an intermetallic compound in a space between the plurality of first and corresponding second metal posts. Growing the intermetallic compound includes setting a first surface, in contact with the solder material between the plurality of first and corresponding second metal posts, to a first temperature, thereby enabling growth of the intermetallic compound; setting a second surface, in contact with the solder material between the plurality of first and corresponding second metal posts, to a second temperature, wherein the second temperature is higher than the first temperature; and maintaining a temperature gradient (temperature/unit thickness) between the plurality of first and corresponding second metal posts at a predetermined value or higher until the intermetallic compound substantially fills the space between the first and corresponding second metal posts.

In this aspect of the present invention, an intermetallic compound can be grown between two metal posts in the joint between the circuit board and the semiconductor chip in a short period of time using temperature difference heating with a predetermined temperature gradient. As a result, an intermetallic compound (IMC) can be formed in the entire joint in a short period of time while also maintaining a constant thickness. This enables a solder joint to be obtained which suppresses the stress on the solder joint between the circuit board and the semiconductor chip, improves EM resistance, and enables a pre-applied resin technique to be used.

BRIEF DESCRIPTION OF THE SEVERAL VIEWS OF THE DRAWINGS

Features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
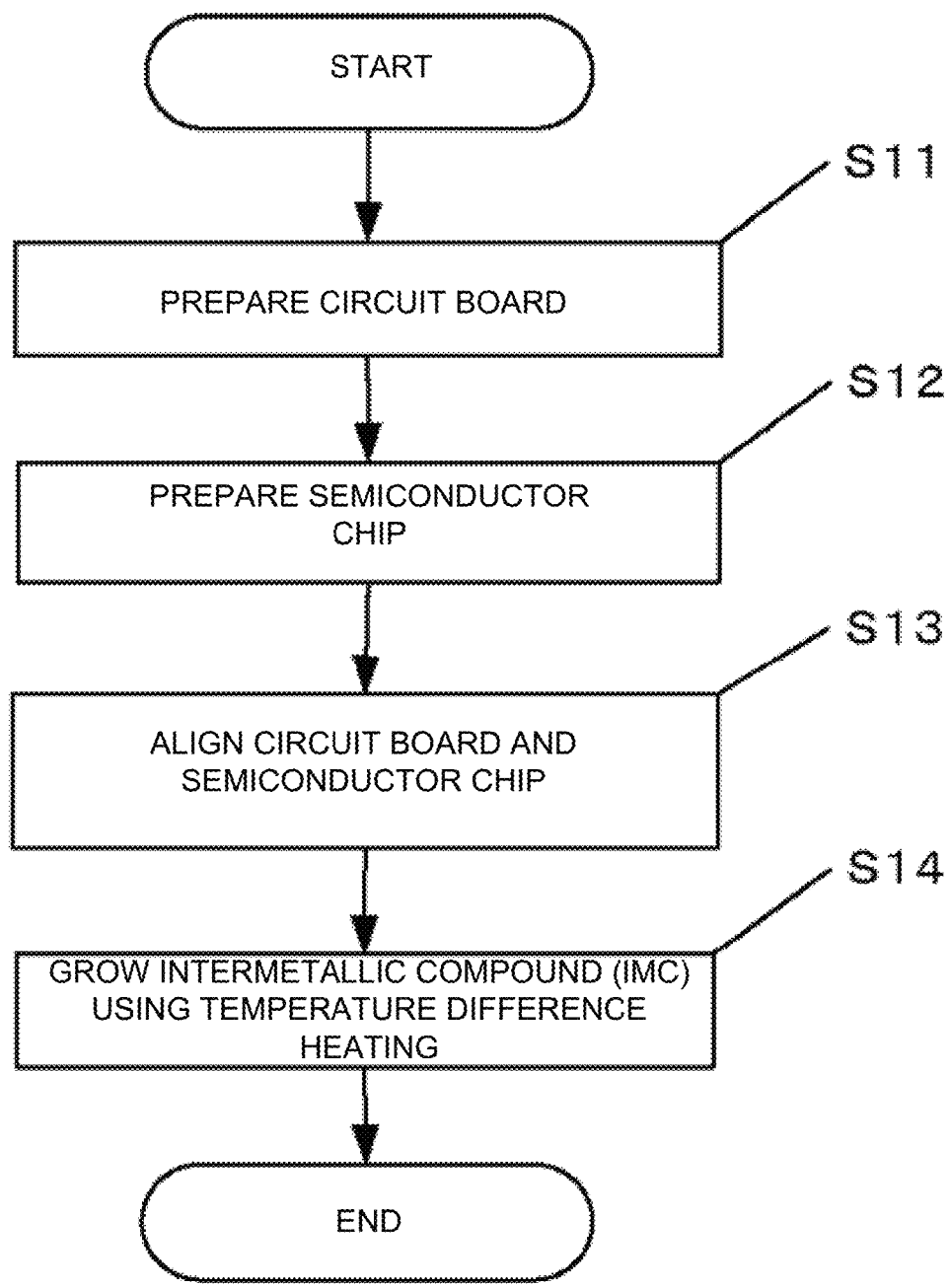
FIG. 1 is a flowchart illustrating an embodiment of the present invention.
Figure 2:
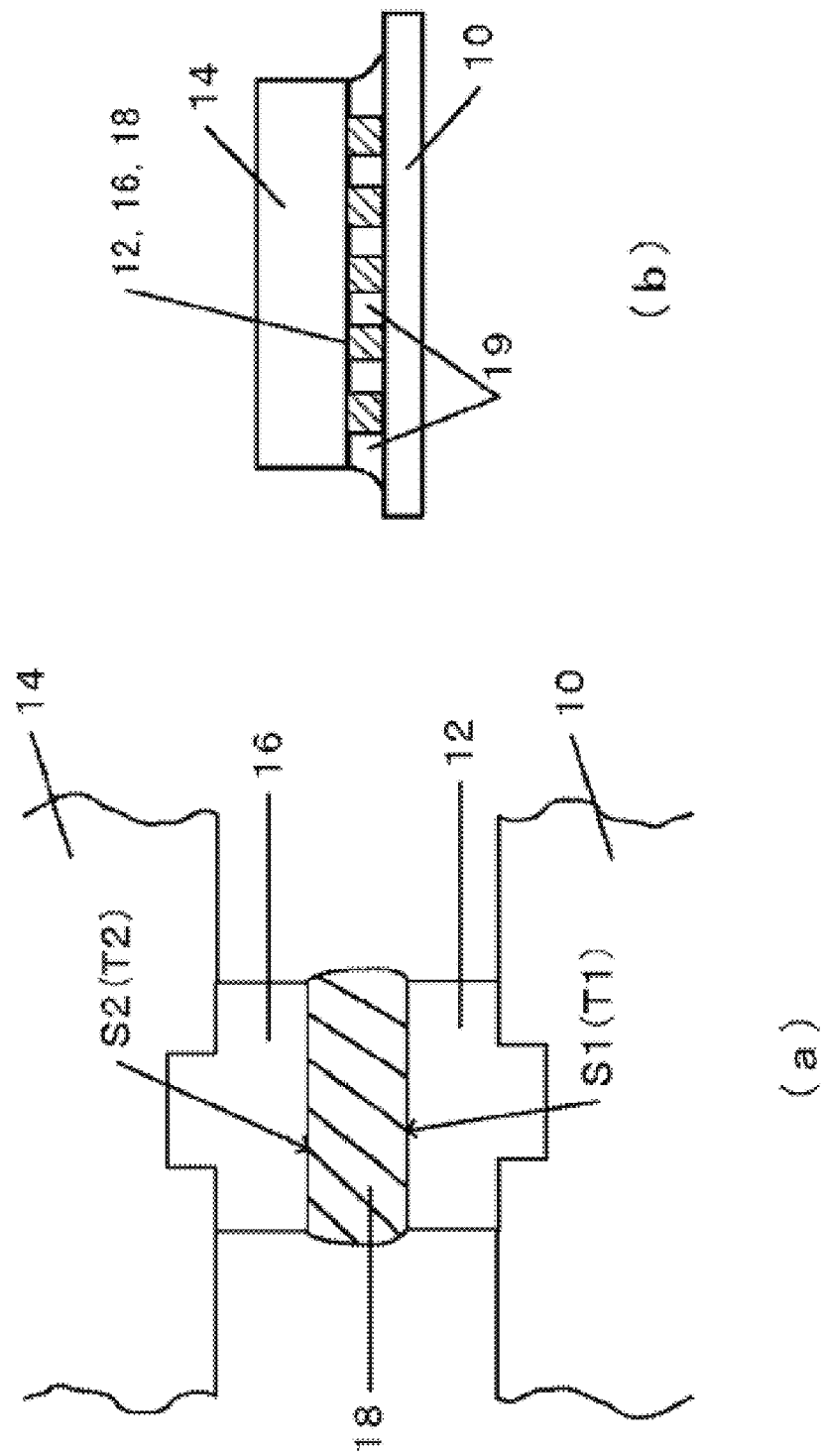
FIG. 2 is a cross-sectional view of joints, in accordance with an embodiment of the present invention.

The following is an explanation of an embodiment of the present invention with reference to the drawings. FIG. 1 is a basic flowchart illustrating an embodiment of the present invention, and FIG. 2 is a cross-sectional view of joints after alignment, in accordance with an embodiment of the present invention. With reference to FIG. 1 and FIG. 2, the following is an explanation of the flow of an embodiment of the present invention.

At S11 of FIG. 1, a first substrate (referred to below as a "circuit board") is prepared so as to have a plurality of metal layers (referred to below as "first metal posts") on the surface. As shown in FIG. 2 (a), there are a plurality of first metal posts 12 on the surface of the circuit board 10. The circuit board 10 (wiring board) includes a plurality of alternately laminated wiring layers and insulating layers. The first metal posts 12 are made of copper (Cu) or nickel (Ni), for example.

At S12, a second substrate (referred to below as a "semiconductor chip") is prepared so as to include a plurality of metal layers (referred to below as "second metal posts") aligned with the first metal posts on the surface, and having solder material on the second metal posts. In FIG. 2 (a), second metal posts 16 and solder material 18 are shown on the surface of the semiconductor chip 14 after joining. The semiconductor chip 14 is an integrated circuit (IC) chip, for example.

As in the case of the first metal posts 12, the second metal posts 16 are made of copper (Cu) or nickel (Ni), for example. The solder material 18 may be a Pb-free solder metal whose main component is Sn alone, Sn including at least one metal selected from a group including Ag, Au, Cu, Ni, Bi, In, Zn, Co, Ge, Fe and Ti, or In.

At S13, each of the first metal posts 12 on the circuit board 10 are joined to the solder material on each of the corresponding second metal posts 16 on the semiconductor chip 14. In FIG. 2 (b), all of them have been joined together. As shown in FIG. 2 (b), the joints (12, 16, 18) are aligned in the joined circuit board 10 and semiconductor chip 14. The joining operation can be performed using a flip chip bonder (FC bonder), for example.

Afterwards, an underfill can be formed (injected) between the joined circuit board 10 and the semiconductor chip 14. As shown in FIG. 2 (b), the underfill 19 is formed so as to fill the joined space. A resin (underfill) 19 may be formed between the circuit board 10 and the semiconductor chip 14 during the joining process using the pre-applied resin technique.

At S14, the joined circuit board 10 and semiconductor chip 14 are heated to grow an intermetallic compound (hereafter, referred to as IMC) between each pair of metal posts 12, 16. During the growing process, one of the surfaces S1 of two metal posts 12, 16 in contact with the solder material is set (heated) to a first temperature T1 enabling growth of the intermetallic compound (IMC), and the other surface S2 of the two metal posts 12, 16 in contact with the solder material is heated to a second temperature T2 which is higher than the first temperature T1. In other words, there is a difference in temperature $\Delta T(=T2-T1)$ at both ends of the solder material layer between the metal posts. These temperatures T1, T2 (temperature difference $\Delta T$) may be obtained by heating the circuit board 10 and the semiconductor chip 14 separately. The heating process can be performed by bringing the surfaces of the circuit board 10 and the semiconductor chip 14 into direct contact with the heat source, or by heating the surfaces without contact using infrared heat.

These temperatures T1, T2 (temperature difference $\Delta T$) are set and controlled in order to obtain a predetermined temperature gradient (temperature/unit thickness) between the metal posts. The heating is performed until the intermetallic compound (IMC) substantially fills the space between the two metal posts 12, 16 by maintaining the temperature gradient (temperature/unit thickness) between the two metal posts 12, 16 at a predetermined value or higher. The predetermined value for the temperature gradient (temperature/unit thickness) can be 0.1° C./μm, for example. The intermetallic compound (IMC) can be grown until the thickness is equal to or greater than 10 micrometers (μm), for example.

An intermetallic compound (IMC) with a thickness of 10 μm can be obtained at a temperature gradient of 0.1° C./μm (using heat control) by setting temperature T1 to 250° C. and temperature T2 to 251° C. (temperature difference $\Delta T=1°$ C.). Generally speaking, an intermetallic compound (IMC) with a thickness of N*10 μm can be obtained at a temperature gradient of 0.1° C./μm by performing the heating process so that the temperature difference $\Delta T=N°$ C. More specifically, an intermetallic compound (IMC) with a thickness of N*10 μm can be obtained at a temperature gradient of 0.1*M° C.μm by performing the heating process so that the temperature difference $\Delta T=N*M°$ C.

Figure 3:
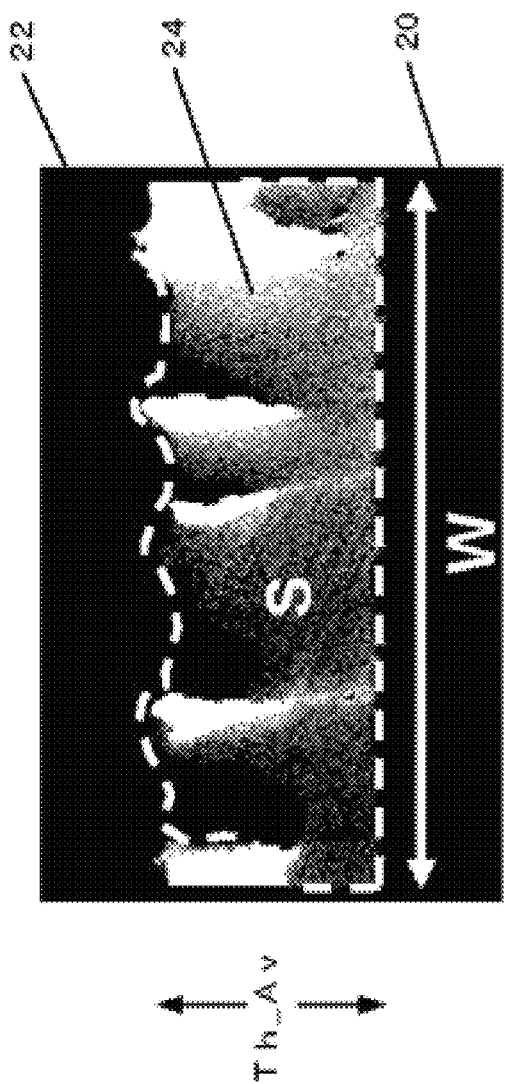
FIG. 3 is a diagram depicting the determination of the thickness of the intermetallic compound (IMC), in accordance with an embodiment of the present invention.

The following describes how the thickness of the intermetallic compound (IMC) can be determined, with reference to FIG. 3. FIG. 3 is a diagram depicting the determination of the thickness of the intermetallic compound (IMC), in accordance with an embodiment of the present invention. In FIG. 3, the surface area S surrounded by the white dotted lines is determined using image processing. The average thickness Th_Av of the intermetallic compound (IMC) 24 is determined by dividing this surface area S, between the metal posts 20, 22, by the width W of the joint shown in FIG. 3.

Figure 4:
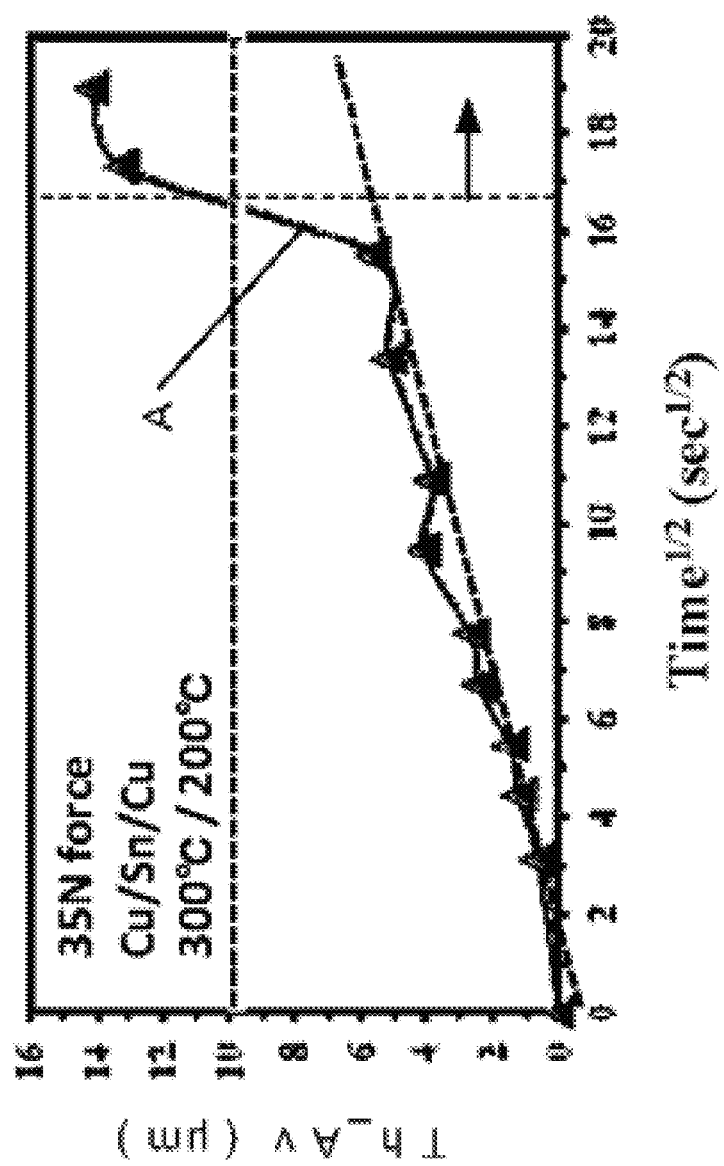
FIG. 4 is a diagram depicting the determination of the joint heating time, in accordance with an embodiment of the present invention.
Figure 5:
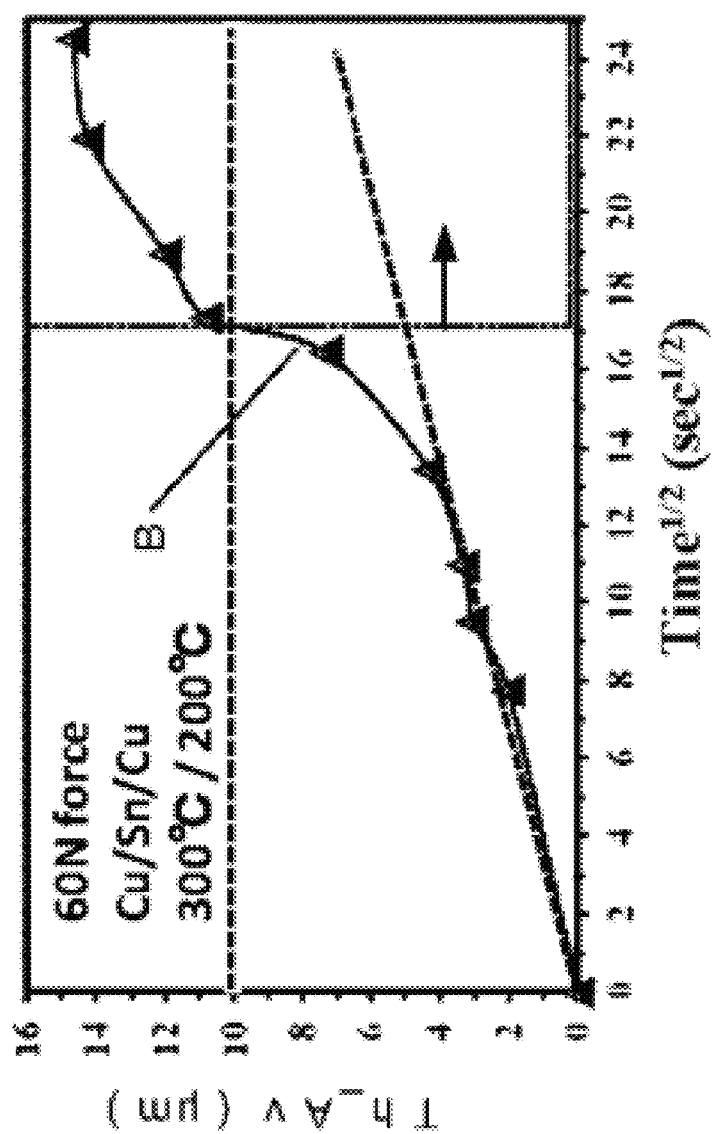
FIG. 5 is a diagram depicting the determination of the joint heating time, in accordance with an embodiment of the present invention.

The following describes how the heating time of S14 (FIG. 1) can be determined, with reference to FIG. 4 and FIG. 5. FIG. 4 and FIG. 5 are diagrams depicting the determination of the joint heating time, in accordance with an embodiment of the present invention. In both diagrams, the horizontal axis represents the square root of the heating time T, and the vertical axis represents the average thickness Th_Av (μm) of the intermetallic compound (IMC), as described above with reference to FIG. 3. In both diagrams, the material composing the joints (12, 18, 16 in FIG. 2) is Cu/Sn/Cu. The temperatures of the heat sources used to obtain the temperatures T1, T2 (temperature difference ΔT) are 200° C. and 300° C., respectively. In FIG. 4, the joints are subjected to 35 newtons (N) of force. In FIG. 5, the joints are subjected to 60 N of force.

In FIG. 4, graph A begins to rise sharply around time 16 ($sec^{1/2}$). In FIG. 5, graph B begins to rise sharply around time 14 ($sec^{1/2}$). The difference in the times at which graph A and graph B begin to rise can be attributable to the difference in applied force (N) (35 versus 60). The sharp rise can be caused by the change from a state in which none of the two metal posts are joined by an intermetallic compound (IMC) to a state in which the metal posts are partially joined by an intermetallic compound (IMC). Embodiments of the present invention are largely characterized by the ability to obtain an intermetallic compound (IMC) of a predetermined thickness (for example, 10 μm or more) by performing the heating process beyond the point at which the thickness begins to rise sharply.

For example, it is clear that, in order to obtain an intermetallic compound (IMC) with an average thickness of 10 μm or greater, the heating process should continue for at least time 17 ($sec^{1/2}$), after graphs A (FIG. 4) and graph B (FIG. 5) begin to change (as indicated by the arrows pointing to the right in the figures). Because time 17 ($sec^{1/2}$) corresponds approximately to 290 seconds (s), an intermetallic compound (IMC) of 10 μm or more can be obtained by heating the joint for approximately 5 minutes (min) (or longer).

Figure 6:
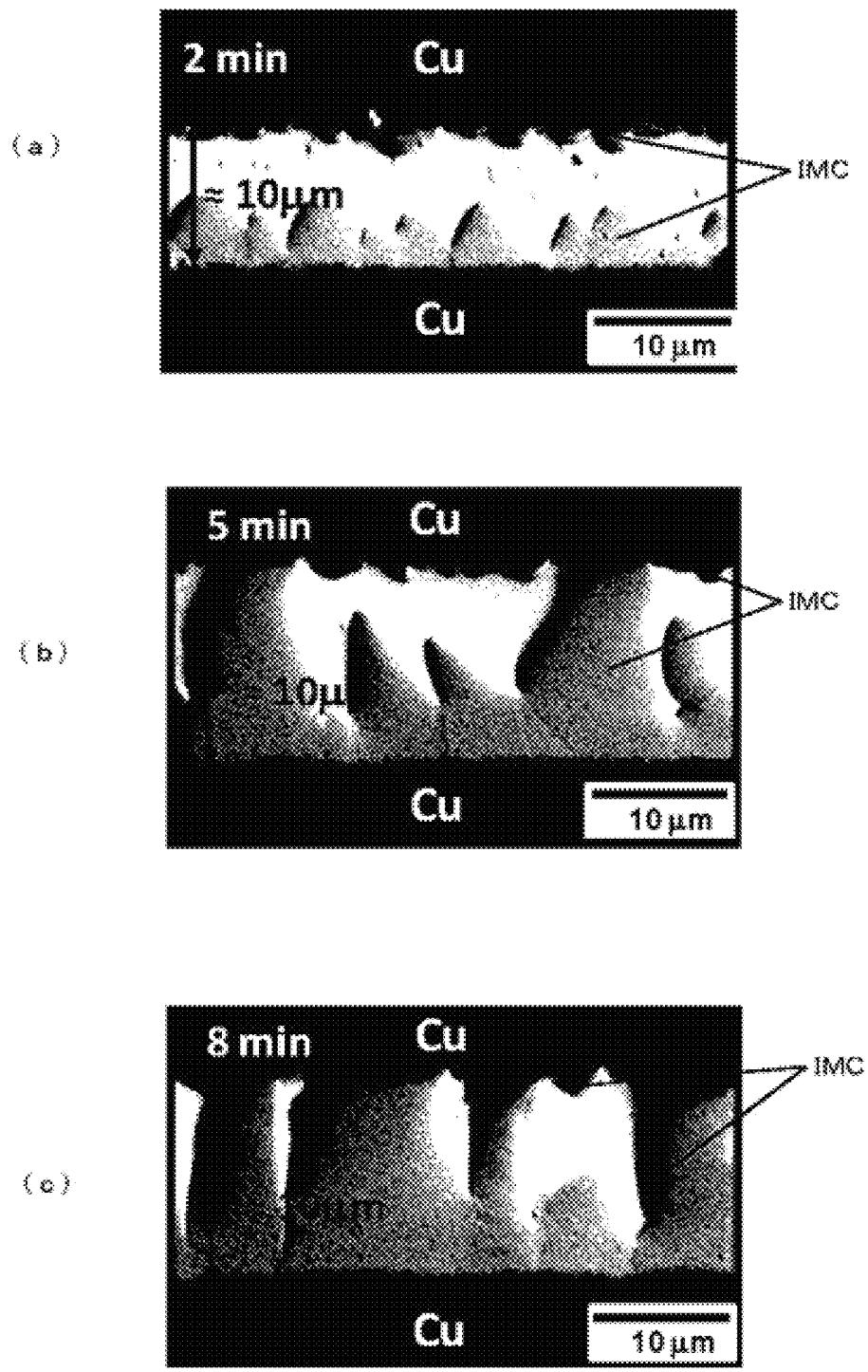
FIG. 6 depicts exemplary test results from growing intermetallic compounds (IMC) in joints, in accordance with an embodiment of the present invention.

With reference to FIG. 6, the following is an explanation of exemplary test results from growing an intermetallic compound (IMC) between joints. FIG. 6 depicts exemplary test results from growing an intermetallic compound (IMC) between two copper (Cu) posts, in accordance with an embodiment of the present invention. In FIG. 6, the joints were heated for (a) two minutes, (b) five minutes, and (c) eight minutes. As in FIG. 4 and FIG. 5, the temperatures of the heat sources were 200° C. (lower) and 300° C. (upper).

During the heating period, an intermetallic compound (IMC) was grown from the lower Cu post, which had a lower temperature, over a period of heating time, towards the upper Cu post, which had a higher temperature. Embodiments of the present invention are characterized by a heating process performed with a temperature difference between the two metal posts. The temperature difference of the heating process can sharply increase the thickness of the intermetallic compound (IMC) when the intermetallic compound (IMC) is grown in one direction.

From the exemplary test results in FIG. 6 (b) and FIG. 6 (c), it is clear that an intermetallic compound (IMC) of at least 10 μm is grown between the two copper (Cu) posts after about five minutes. These results reinforce the necessity to heat the joint for five minutes or more in order to obtain an intermetallic compound (IMC) of 10 μm or more, as described above with reference to FIG. 4 and FIG. 5.

Figure 7:
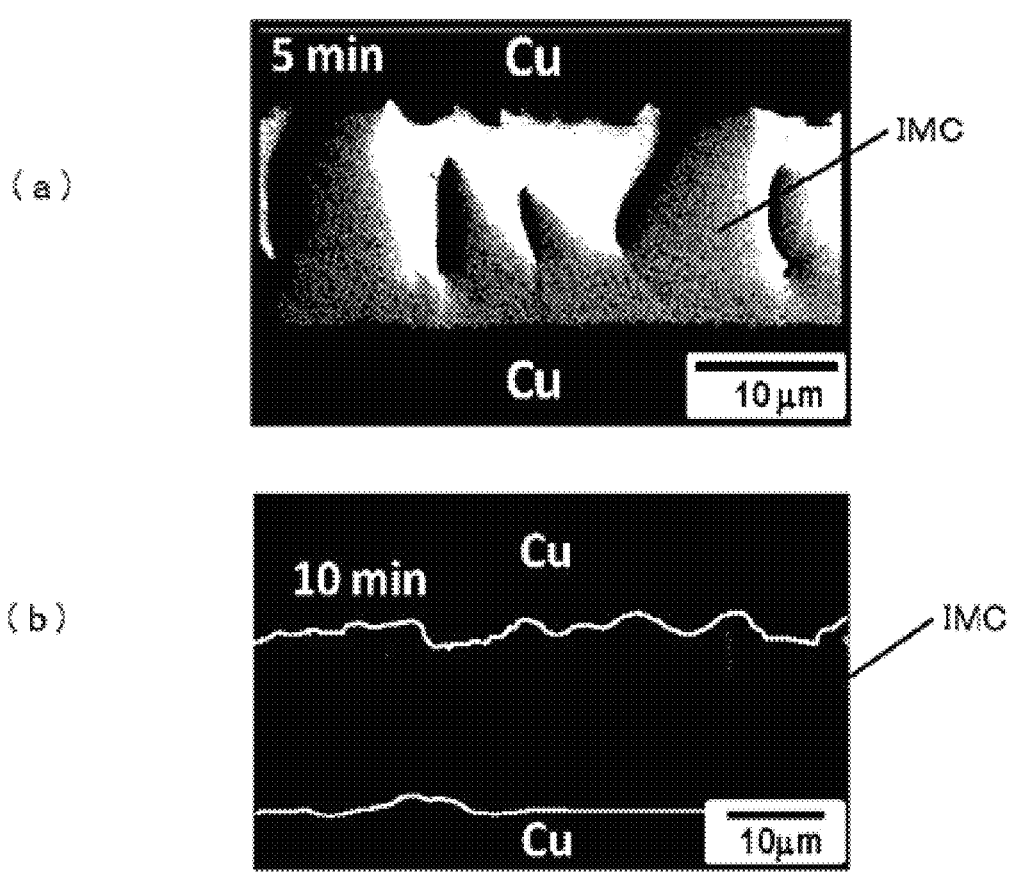
FIG. 7 depicts exemplary test results from growing intermetallic compounds (IMC) in joints, in accordance with an embodiment of the present invention.
Figure 8:
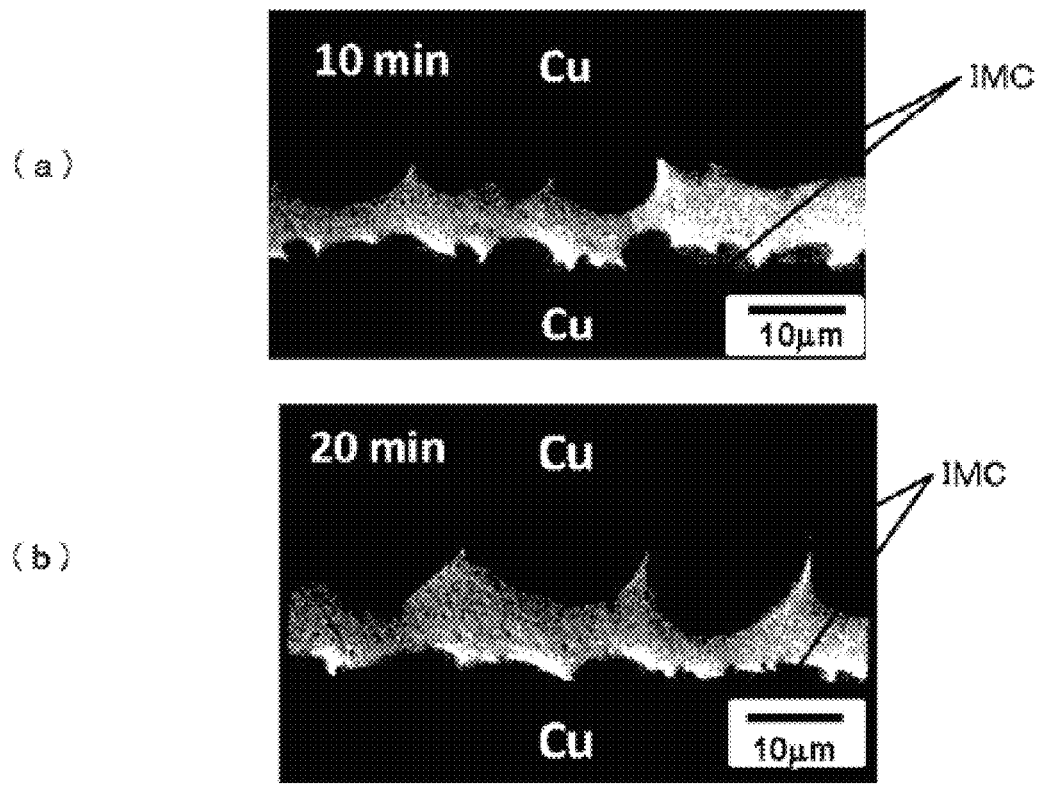
FIG. 8 depicts exemplary test results from growing intermetallic compounds (IMC) in joints using a method of the prior art.

With reference to FIG. 7 and FIG. 8, the following compares the exemplary results obtained using embodiments of the present invention with results obtained using prior art. FIG. 7 depicts exemplary test results from growing an intermetallic compound (IMC) between two copper (Cu) posts, in accordance with an embodiment of the present invention. The heating conditions are the same as those in FIG. 6, namely, 200° C. (lower) and 300° C. (upper). FIG. 7 (a) shows the IMC growth results after five minutes, and FIG. 7 (b) shows the IMC growth results after ten minutes. After five minutes of IMC growth from below, the two Cu posts are nearly entirely filled (connected). After ten minutes, the two Cu posts are completely filled. In FIG. 7 (b), the white lines imposed on the image indicate the boundary (interface) between the IMC and each Cu post.

FIG. 8 depicts exemplary test results from growing an intermetallic compound (IMC) between two copper (Cu) posts using the method of the prior art. The heating conditions are the same, namely, 250° C. above and below. In the method of the prior art, the temperature difference heating of embodiments of the present invention is not used. It is clear from FIG. 8 that, when temperature difference heating is not performed, the IMC begins to grow from both of the Cu posts, but there is greater growth from the upper Cu post. However, as shown in FIG. 8 (b), the two Cu posts are still not filled (connected) after 20 minutes. Therefore, in comparison with FIG. 7 (b), showing results of embodiments of the present invention, it is clear that embodiments of the present invention can grow an intermetallic compound (IMC) of the desired thickness in a shorter period of time.

The solder joints obtained in the embodiment of the present invention have the following characteristics:

(i) The unevenness (roughness) of the interface between the lower-temperature metal (Cu) (lower post in FIG. 2 and FIG. 6) and the IMC is not as great as the unevenness (roughness) of the interface between the higher-temperature metal (upper post in FIG. 2 and FIG. 6) and the intermetallic compound.

(ii) Because the IMC growth from one side (the lower side in FIG. 2 and FIG. 6) is dominant, each grain of the IMC (for example, Cu6Sn5) connecting the IMC layer (for example, Cu3Sn) on both ends of the solder joint has become single. In other words, the crystal orientation is aligned.

Embodiments of the present invention were explained above with reference to the drawings. However, the present invention is not limited to these embodiments. In addition, the present invention can be embodied in many different ways, including improvements and modifications as well as variations, based on knowledge common in the art without departing from the spirit and scope of the invention, as defined in the following claims.

What is claimed is:

1. A method for forming a solder joint between metal layers, the method comprising:
  preparing a structure having solder material placed between two metal layers; and
  heating the structure to grow an intermetallic compound in a space between the two metal layers, wherein growing the intermetallic compound includes:
    setting a first surface, in contact with the solder material between the two metal layers, to a first temperature, thereby enabling growth of the intermetallic compound;
    setting a second surface, in contact with the solder material between the two metal layers, to a second temperature, wherein the second temperature is higher than the first temperature; and
    maintaining a temperature gradient (temperature/unit thickness) between the two metal layers at a predetermined value or higher until the intermetallic compound substantially fills the space between the two metal layers.

2. The method according to claim 1, wherein the predetermined value for the temperature gradient is 0.1° C./μm.

3. The method according to claim 1, wherein an average thickness of the intermetallic compound between the two metal layers is at least 10 μm.

4. The method according to claim 1, wherein the two metal layers include Cu or Ni, and the solder material includes a Pb-free solder metal including Sn alone, Sn including at least one metal selected from a group including Ag, Au, Cu, Ni, Bi, In, Zn, Co, Ge, Fe and Ti, and In.

5. The method according to claim 1, wherein preparing the structure further comprises:
  preparing a first substrate having a plurality of first metal posts provided on a surface;
  preparing a second substrate having a plurality of second metal posts aligned with the first metal posts provided on a surface, and having a solder material provided on the plurality of second metal posts; and
  forming the structure by joining the plurality of first metal posts of the first substrate to the solder material on the plurality of second metal posts of the second substrate.

6. The method according to claim 5, wherein the first substrate is a circuit board, and the second substrate is a semiconductor chip.

7. The method according to claim 6, further comprising:
  forming an underfill between the circuit board and the semiconductor chip.

8. A method for solder-joining a semiconductor chip to a semiconductor substrate, the method comprising:
  preparing a circuit board having a plurality of first metal posts provided on a surface;
  preparing a semiconductor chip having a plurality of second metal posts aligned with the first metal posts provided on the surface of the circuit board, and having a solder material provided on the plurality of second metal posts;
  forming a structure by joining the plurality of first metal posts on the surface of the circuit board to the solder material on the plurality of corresponding second metal posts of the semiconductor chip; and
  heating the structure to grow an intermetallic compound in a space between the plurality of first and corresponding second metal posts, wherein growing the intermetallic compound includes:
    setting a first surface, in contact with the solder material between the plurality of first and corresponding second metal posts, to a first temperature, thereby enabling growth of the intermetallic compound;
    setting a second surface, in contact with the solder material between the plurality of first and corresponding second metal posts, to a second temperature, wherein the second temperature is higher than the first temperature; and
    maintaining a temperature gradient (temperature/unit thickness) between the plurality of first and corresponding second metal posts at a predetermined value or higher until the intermetallic compound substantially fills the space between the first and corresponding second metal posts.

9. The method according to claim 8, wherein forming the structure further comprises:
  forming an underfill between the circuit board and the semiconductor chip.

10. The method according to claim 8, wherein the predetermined value for the temperature gradient is 0.1° C./μm.

11. The method according to claim 8, wherein an average thickness of the intermetallic compound between the plurality of first and corresponding second metal posts is at least 10 μm.

12. The method according to claim 8, wherein the plurality of first and corresponding second metal posts include Cu or Ni, and the solder material includes a Pb-free solder metal including Sn alone, Sn including at least one metal selected from a group including Ag, Au, Cu, Ni, Bi, In, Zn, Co, Ge, Fe and Ti, and In.

* * * * *